United States Patent
Dan et al.

(10) Patent No.: US 8,515,374 B2
(45) Date of Patent: Aug. 20, 2013

(54) PLL CIRCUIT, AND RADIO COMMUNICATION APPARATUS EQUIPPED WITH SAME

(75) Inventors: Toru Dan, Gifu (JP); Tomoyuki Tanabe, Kiryu (JP); Haruo Kobayashi, Kiryu (JP)

(73) Assignee: Semiconductor Components Industries, LLC, Gunma (JP)

( * ) Notice: Subject to any disclaimer, the term of this patent is extended or adjusted under 35 U.S.C. 154(b) by 48 days.

(21) Appl. No.: 13/381,608

(22) PCT Filed: Jun. 28, 2010

(86) PCT No.: PCT/JP2010/004255
§ 371 (c)(1),
(2), (4) Date: Dec. 29, 2011

(87) PCT Pub. No.: WO2011/001652
PCT Pub. Date: Jan. 6, 2011

(65) Prior Publication Data
US 2012/0100821 A1    Apr. 26, 2012

(30) Foreign Application Priority Data
Jul. 2, 2009    (JP) .................................. 2009-157749

(51) Int. Cl.
*H04B 7/00* (2006.01)
(52) U.S. Cl.
USPC ........... 455/255; 455/260; 455/265; 455/269; 455/232.1; 455/77
(58) Field of Classification Search
USPC ................. 455/255, 260, 265, 269, 232.1, 77
See application file for complete search history.

(56) References Cited

U.S. PATENT DOCUMENTS

| | | | | |
|---|---|---|---|---|
| 4,733,301 | A * | 3/1988 | Wright, Jr. | 348/731 |
| 4,748,684 | A * | 5/1988 | Wright, Jr. | 455/182.3 |
| 7,760,042 | B2 * | 7/2010 | Mayer et al. | 332/128 |
| 2002/0094052 | A1 | 7/2002 | Staszewski et al. | |
| 2003/0107442 | A1 | 6/2003 | Staszewski | |
| 2003/0133522 | A1 | 7/2003 | Staszewski et al. | |
| 2003/0141936 | A1 | 7/2003 | Staszewski et al. | |
| 2006/0030277 | A1 * | 2/2006 | Cyr et al. | 455/77 |
| 2009/0052508 | A1 | 2/2009 | Takahashi | |
| 2009/0079508 | A1 | 3/2009 | Tsuda | |

FOREIGN PATENT DOCUMENTS

| | | |
|---|---|---|
| JP | 2001-177407 | 6/2001 |
| JP | 2002-204160 | 7/2002 |
| JP | 2009-021954 | 1/2009 |
| JP | 2009-027581 | 2/2009 |
| JP | 2009-081740 | 4/2009 |

OTHER PUBLICATIONS

International Search Report issued in International Patent Application No. PCT/JP2010/004255, mailed Sep. 14, 2010.

(Continued)

*Primary Examiner* — Sanh Phu
(74) *Attorney, Agent, or Firm* — McDermott Will & Emery LLP

(57) ABSTRACT

In an ADPLL circuit, on the basis of a gain of a digitally controlled oscillator estimated when a loop gain of a certain value is set in the loop filter and on the basis of a device parameter of the digitally controlled oscillator, the DCO gain estimation unit estimates a gain of the digitally controlled oscillator when a loop gain of another value is set in the loop filter.

6 Claims, 10 Drawing Sheets

(56) References Cited

OTHER PUBLICATIONS

International Preliminary Report on Patentability and Written Opinion of the International Searching Authority issued in International Patent Application No. PCT/JP2010/004255, mailed Feb. 14, 2012.

Tomoyuki Tanabe et al., "Study of ADPLL for TV Tuner," Proceedings of the 2009 IEICE General Conference Electronics 2, pp. 132, The Institute of Electronics, Information and Communication Engineers, Mar. 2009, with English Translation.

* cited by examiner

100

10

PLL CIRCUIT, AND RADIO COMMUNICATION APPARATUS EQUIPPED WITH SAME

RELATED APPLICATIONS

This application is the U.S. National Phase under 35 U.S.C. §371 of International Application No. PCT/JP2010/004255, filed on Jun. 28, 2010, which in turn claims the benefit of Japanese Application No. 2009-157749, filed on Jul. 2, 2009, the disclosures of which Applications are incorporated by reference herein.

FIELD OF THE INVENTION

The present invention relates to a PLL circuit using a Digitally Controlled Oscillator (DCO) and a radio communication apparatus equipped with the PLL circuit.

DESCRIPTION OF THE RELATED ART

In recent years, an All Digitally Phase Locked Loop (AD-PLL) circuit in which most of constituent elements of the PLL circuit are achieved with digitally circuits has been developed. The ADPLL circuit is different from a conventional analog PLL circuit in that the ADPLL circuit does not require any charge pump circuit or any analog LPF, and therefore the size of the PLL circuit can be reduced. In addition, the ADPLL circuit is advantageous in process portability, process scalability, and flexibility, and is capable of operating with a low voltage.

A method is known to reduce, in a stepwise manner, the value of the loop gain set in the loop filter in order to converge the frequency to the target frequency in a short time with a high degree of accuracy when the output frequency is set or changed in the PLL circuit. The smaller the value of the loop gain is, the smaller the change of the output frequency becomes. Therefore, when the value of the loop gain is small, it takes a longer convergence time to attain the target frequency. On the other hand, when the value of the loop gain is large, it takes a shorter convergence time to attain the target frequency, but the frequency change becomes rough, which reduces the accuracy of convergence.

In the above method, when the loop gain is set at a large value at first, the output frequency is brought closer to the target frequency in a short time, and thereafter, the loop gain is switched to a smaller value, so that the output frequency is changed minutely. As a result, the frequency can attain the target frequency in a short time with a high degree of accuracy. Hereinafter, a state in which a certain loop gain is set is defined as a mode. In this case, the set number of loop gains corresponds to the number of modes.

DISCLOSURE OF THE INVENTION

Problems to be Solved by the Invention

The digitally controlled oscillator provided in the ADPLL circuit employing the above method includes a plurality of circuit elements corresponding to a plurality of modes. The plurality of circuit elements and the plurality of modes are associated with each other. In a certain mode, a circuit element to be controlled is uniquely identified.

Each of the plurality of circuit elements is a circuit element functioning as a digital/analog converter (for example, variable capacitor array). The unit step widths of a plurality of circuit elements are respectively different according to the associated modes. The unit step width of a circuit element associated with a mode of which loop gain is set at a large value is large. The unit step width of a circuit element associated with a mode of which loop gain is set at a small value is small.

By the way, the digitally controlled oscillator has a DCO gain. The DCO gain means the value representing the amount of variation of the output frequency in response to change of 1 LSB (Least Significant Bit) in the set digital value. The value of the DCO gain changes according to the process, the power supply voltage, and the temperature. The value of the DCO gain is different according to which of the plurality of circuit elements is to be controlled. Therefore, unless the DCO gain of the digitally controlled oscillator is estimated and the DCO gain is normalized, it is difficult to achieve a desired oscillation frequency with a high degree of accuracy.

When the mode is switched in the ADPLL circuit employing the above method, the DCO gain in the mode is estimated, and a parameter for normalizing the estimated DCO gain is set. Thereafter, the convergence frequency in that mode is searched. The time taken in the estimation processing of the DCO gain is a cause of increasing the convergence time.

Under such circumstances, the inventors of the present application has found a method for reducing the time taken in the estimation processing of the DCO gain executed during switching of the mode, as compared with the currently available method.

Means for Solving the Problems

A PLL circuit according to an aspect of the present invention includes a digitally controlled oscillator for oscillating at a frequency according to a set digital value, a phase detector for generating a phase error value by detecting an error between an output phase of the digitally controlled oscillator and a reference phase based on a set frequency control digital value, a loop filter for generating a first digital tuning value by multiplying a phase error value output from the phase detector by a predetermined loop gain, an oscillator gain normalization unit which generates a second digital tuning value set in the digitally controlled oscillator, by multiplying the first digital tuning value output from the loop filter by a predetermined reference frequency and dividing the value by a set gain of the digitally controlled oscillator, an oscillator gain estimation unit which estimates the gain of the digitally controlled oscillator, on the basis of the second digital tuning value output from the oscillator gain normalization unit, and a mode switch unit which switches the value of the loop gain set in the loop filter in a stepwise manner during tuning. In a certain mode, the oscillator gain estimation unit estimates the gain of the digitally controlled oscillator from a ratio between a change of a frequency of the output signal of the digitally controlled oscillator and a change of the second digital tuning value obtained by changing the frequency control digital value, and the oscillator gain estimation unit estimates a gain of the digitally controlled oscillator in another mode, on the basis of a device parameter of the digitally controlled oscillator and the gain of the digitally controlled oscillator estimated in the certain mode.

Another aspect of the present invention is a radio communication apparatus. This apparatus includes an antenna for receiving a radio signal, a local oscillator using the PLL circuit, and a demodulation unit which demodulates a radio signal received with the antenna on the basis of a signal provided from the local oscillator.

BEST MODE FOR CARRYING OUT THE INVENTION

Figure 1:
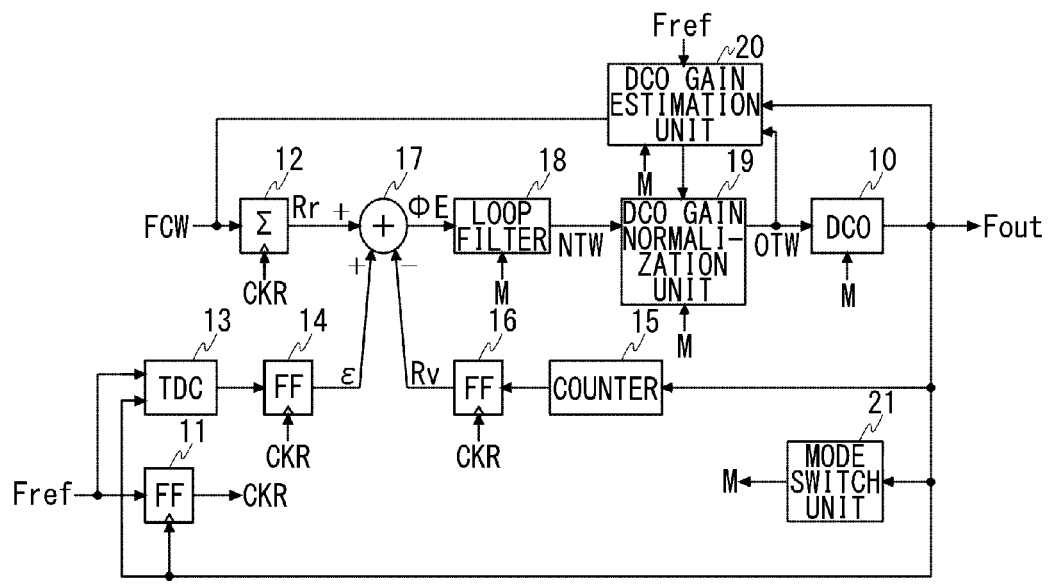
FIG. 1 is a figure illustrating a configuration of an ADPLL circuit according to an embodiment of the present invention.

FIG. 1 is a figure illustrating a configuration of an ADPLL circuit 100 according to an embodiment of the present invention. The ADPLL circuit 100 includes a digitally controlled oscillator 10, a retiming clock generation unit 11, an accumulator 12, a time/digital converter (TDC) 13, a first flip-flop circuit 14, a counter 15, a second flip-flop circuit 16, a phase detector 17, a loop filter 18, a DCO gain normalization unit 19, a DCO gain estimation unit 20, and a mode switch unit 21.

The digitally controlled oscillator 10 oscillates at a frequency according to a set digital value. The retiming clock generation unit 11 generates a retiming clock signal CKR by retiming a reference frequency signal Fref on the basis of an output signal Fout given by the digitally controlled oscillator 10.

The reference frequency signal Fref is generated by, e.g., a crystal oscillator, not shown. In the present embodiment, an oscillator oscillating at a frequency of about 20 to 40 MHz is used. The retiming clock signal CKR generated by the retiming clock generation unit 11 is respectively supplied to the accumulator 12, the first flip-flop circuit 14, and the second flip-flop circuit 16.

The accumulator 12 accumulates and adds a frequency control digital value (FCW; frequency control word) set by an external unit in accordance with the retiming clock signal CKR, generates a reference phase data Rr, and outputs the reference phase data Rr to the phase detector 17.

The time/digital converter 13 converts a time difference between the reference frequency signal Fref and the output signal Fout given by the digitally controlled oscillator 10 into a digital value. More specifically, the time/digital converter 13 detects a time difference in a unit less than one cycle of the output signal Fout given by the digitally controlled oscillator 10, and outputs the time difference as fractional data $\epsilon$. The first flip-flop circuit 14 latches the fractional data $\epsilon$ output from the time/digital converter 13 in accordance with the retiming clock signal CKR, and outputs the fractional data $\epsilon$ to the phase detector 17.

The counter 15 counts significant edges (for example, rising edges) of the output signal Fout given by the digitally controlled oscillator 10. This count value is output as integer data Rv. The second flip-flop circuit 16 latches the integer data Rv output from the counter 15 in accordance with the retiming clock signal CKR, and outputs the integer data to the phase detector 17. The output phase of the digitally controlled oscillator 10 is defined by the integer data Rv and the fractional data $\epsilon$. In the present embodiment, the output phase is defined by the difference between the integer data Rv and the fractional data $\epsilon$.

The phase detector 17 detects an error between the output phase (Rv−$\epsilon$) of the digitally controlled oscillator 10 and the reference phase data Rr generated by the accumulator 12 on the basis of the frequency control digital value FCW, and generates a digital phase error value $\phi$E. The phase detector 17 outputs the generated digital phase error value $\phi$E to the loop filter 18.

Figure 2:
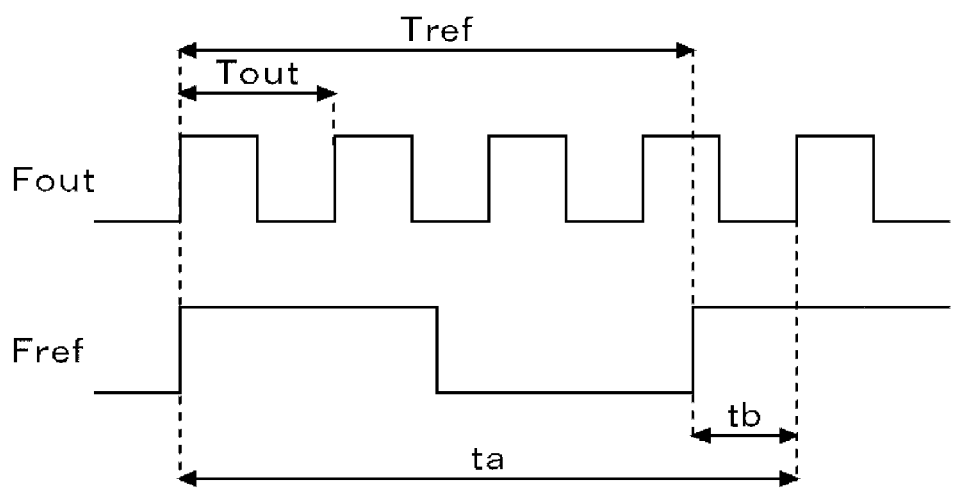
FIG. 2 is a figure for explaining a specific example of generation process of a digital phase error value.

FIG. 2 is a figure for explaining illustrating a specific example of generation process of a digital phase error value $\phi$E. FIG. 2 illustrates an example in which the reference frequency signal Fref is multiplied by 3.25 and the output signal Fout of the digitally controlled oscillator 10 is generated. In this example, four cycles ta of the output signal Fout are delayed by a delay period tb with respect to one cycle Tref of the reference frequency signal Fref to be matched with.

The counter 15 counts rising edges of the output signal Fout given by the digitally controlled oscillator 10, thereby detecting an integer part of a value obtained by normalizing the four cycle ta of the output signal Fout with the one cycle Tout of the output signal Fout (ta/Tout). The integer part of this value is the integer data Rv.

The time/digital converter 13 detects a time between a rising edge of the reference frequency signal Fref and a subsequent rising edge of the output signal Fout of the digitally controlled oscillator 10, thereby detecting a value obtained by normalizing the delay period tb with the one cycle Tout of the output signal Fout (tb/Tout). This value is the fractional data $\epsilon$.

Since the period obtained by subtracting the delay period tb from the four cycle ta of the output signal Fout given by the digitally controlled oscillator 10 matches the one cycle Tref of the reference frequency signal Fref, the difference between the integer data Rv and the fractional data $\epsilon$ (Rv−$\epsilon$) matches the value obtained by normalizing the one cycle Tref of the reference frequency signal Fref with the one cycle Tout of the output signal Fout given by the digitally controlled oscillator 10 (Tref/Tout). This value represents a ratio between the one cycle Tout of the output signal Fout given by the digitally controlled oscillator 10 actually observed and the one cycle Tref of the reference frequency signal Fref, i.e., a ratio between the frequency of the output signal Fout given by the digitally controlled oscillator 10 actually observed and the frequency of the reference frequency signal Fref.

The phase detector 17 calculates the digital phase error value $\phi$E by subtracting a ratio between the frequency of the output signal Fout given by the digitally controlled oscillator 10 actually observed and the frequency of the reference frequency signal Fref (Tref/Tout=Rv−$\epsilon$) from the ratio between the target frequency and the frequency of the reference frequency signal Fref (corresponding to the above reference phase data Rr). In other words, the phase detector 17 calculates the digital phase error value $\phi$E by subtracting the difference between the integer data Rv and the fractional data ε from the reference phase data Rr.

Back to FIG. 1, the loop filter 18 multiply the digital phase error value φE output from the phase detector 17 by a predetermined loop gain α, thereby generating a first digital tuning value (NTW; normalized tuning word). In a small mode SM described below, the followability may be improved by multiplying the digital phase error value φE and the loop gain α as well as adding a predetermined integration term. The loop filter 18 outputs the generated first digital tuning value NTW to the DCO gain normalization unit 19.

The DCO gain normalization unit 19 generates a second digital tuning value (OTW; oscillator tuning word), to be set in the digitally controlled oscillator 10, by multiplying the first digital tuning value NTW output from the loop filter 18 by the reference frequency signal Fref and dividing it by the DCO gain $K_{DCO}$ of the digitally controlled oscillator 10 estimated by the DCO gain estimation unit 20. In other words, the DCO gain normalization unit 19 multiplies the first digital tuning value NTW by the value obtained by dividing the reference frequency signal Fref by the DCO gain estimation value $K_{DCO}$ (Fref/$K_{DCO}$). The digitally controlled oscillator 10 generates the frequency output signal Fout according to the second digital tuning value OTW set by the DCO gain normalization unit 19.

The DCO gain estimation unit 20 estimates the DCO gain $K_{DCO}$ of the digitally controlled oscillator 10 on the basis of the second digital tuning value OTW output from the DCO gain normalization unit 19, and sets the DCO gain $K_{DCO}$ in the DCO gain normalization unit 19.

When the ADPLL circuit 100 is tuned, the mode switch unit 21 switches the mode of the ADPLL circuit 100 in a stepwise manner. As a core processing of the switching processing, the mode switch unit 21 switches the value of the loop gain α set in the loop filter 18 in a stepwise manner.

As described above, when the value of the loop gain α is smaller, a higher degree of accuracy of convergence can be obtained, but the convergence time increases. Accordingly, a method is used to switch the loop gain α from a larger value to a smaller value in a stepwise manner.

Figure 3:
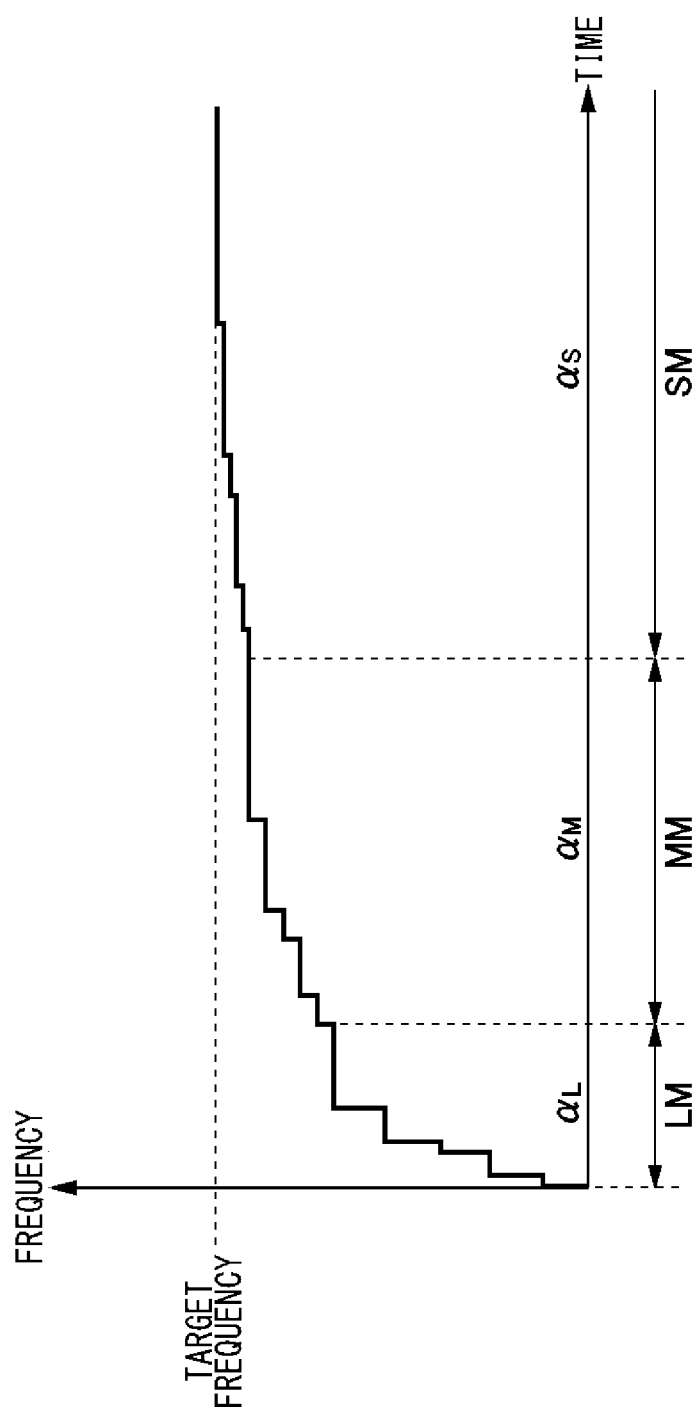
FIG. 3 is a figure illustrating an example of a frequency transition of an output signal given by a digitally controlled oscillator when a loop gain is switched to three levels.

FIG. 3 is a figure illustrating an example of a frequency transition of the output signal Fout given by the digitally controlled oscillator 10 when the loop gain α is switched to three levels. In this case, three modes, i.e., a large mode LM, a middle mode MM, and a small mode SM, are assumed. In the large mode LM, the value of the loop gain α is the highest among the three modes. The large mode LM is a mode in which the frequency of the output signal Fout of the digitally controlled oscillator 10 is changed most greatly. In the middle mode MM, the value of the loop gain α is less than that in the large mode LM. The middle mode MM is a mode in which the frequency of the output signal Fout is changed less greatly than in the large mode LM. In the small mode SM, the value of the loop gain α is further less than that in the middle mode MM. The small mode SM is a mode in which the frequency of the output signal Fout is changed further less greatly than in the middle mode MM.

When the ADPLL circuit 100 is tuned, the mode switch unit 21 switches the mode to the large mode LM, the middle mode MM, and the small mode SM in order. At that occasion, the loop gain α set in the loop filter 18 is switched to a loop gain $α_L$ for the large mode, a loop gain $α_M$ for the middle mode, and a loop gain $α_S$ for the small mode in order. For example, the loop gain $α_L$ for the large mode may be set at 1/8, the loop gain $α_M$ for the middle mode may be set at 1/32, and the loop gain $α_S$ for the small mode may be set at 1/128. When the value of the loop gain α is set at a repeat multiplication of ½, multiplication can be performed by right bit shift operation.

The mode switch unit 21 determines the mode switching timing by monitoring the frequency change of the output signal Fout given by the digitally controlled oscillator 10. For example, when the frequency change within a predetermined setting time in a certain mode is less than a predetermined reference change (hereinafter this is referred to as a case where a convergence condition is satisfied), it is determined that the frequency comes close to the target frequency, and the mode is switched to a smaller mode. As shown in FIG. 3, the mode is switched to the large mode LM, the middle mode MM, and the small mode SM in order, and the target frequency is attained in a short time with a high degree of accuracy.

Subsequently, the estimation processing of the DCO gain $K_{DCO}$ of the digitally controlled oscillator 10 performed by the DCO gain estimation unit 20 will be described. In a certain mode value, the DCO gain estimation unit 20 estimates the DCO gain $K_{DCO}$ of the digitally controlled oscillator 10 from a ratio between a change Δfv of the frequency fv of the output signal Fout of the digitally controlled oscillator 10 and a change ΔOTW of the second digital tuning value OTW obtained by changing the frequency control digital value FCW.

This will be hereinafter described more specifically. When the second digital tuning value OTW set therein changes, the frequency fv of the output signal Fout of the digitally controlled oscillator 10 also changes. The DCO gain $K_{DCO}$ is defined as the ratio of the change Δfv of the frequency fv of the output signal Fout to the change ΔOTW of the second digital tuning value OTW. In other words, the DCO gain $K_{DCO}$ is defined as the change Δfv of the frequency fv of the output signal Fout when the second digital tuning value OTW changes by 1 LSB.

Figure 4:
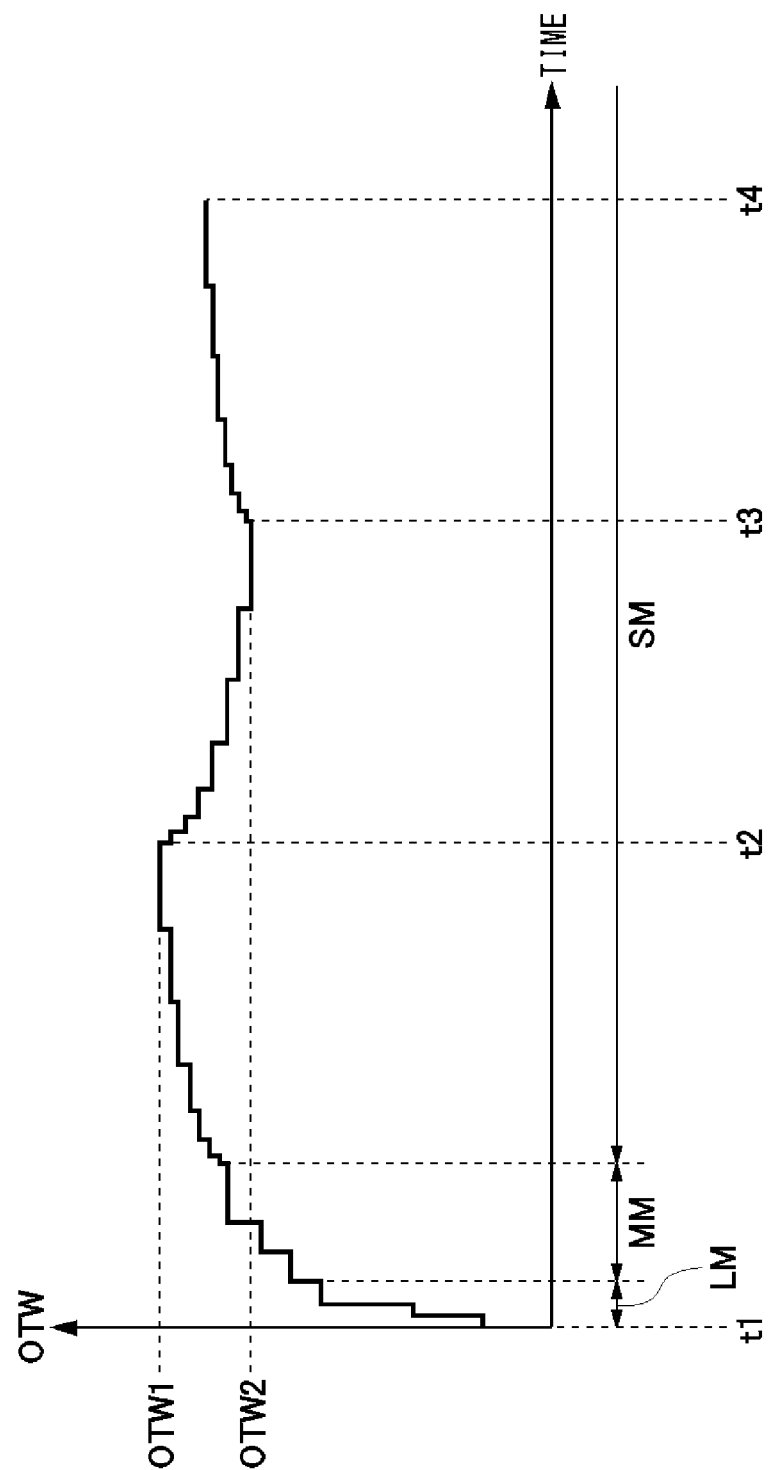
FIG. 4 is a figure illustrating an example of transition of a second digital tuning value when a DCO gain in a small mode is estimated.
Figure 5:
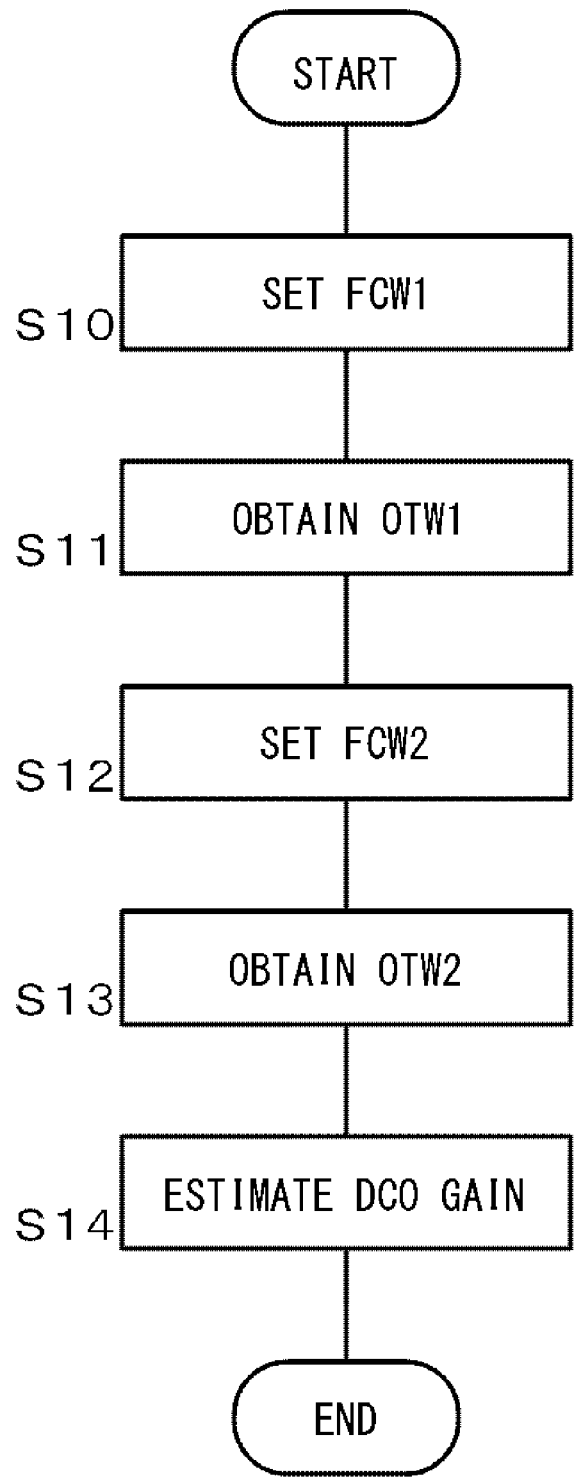
FIG. 5 is a flowchart illustrating a procedure of estimation processing of the DCO gain performed by the DCO gain estimation unit.

FIG. 4 is a figure illustrating an example of transition of the second digital tuning value OTW when the DCO gain $K_{DCOS}$ in the small mode SM is estimated. FIG. 5 is a flowchart illustrating a procedure of estimation processing of the DCO gain $K_{DCO}$ performed by the DCO gain estimation unit 20.

At time t1, the frequency control digital value FCW1 is set in the accumulator 12 by an external unit (S10). The mode switch unit 21 switches the mode to the large mode LM, the middle mode MM, and the small mode SM in order. The DCO gain estimation unit 20 obtains the second digital tuning value OTW1 when the convergence condition of the small mode SM is determined to be satisfied by the mode switch unit 21 (time t2 of FIG. 4) (S11). At this occasion, a temporary DCO gain $K_{DCOS}$ of the small mode SM is set in the DCO gain normalization unit 19.

When the second digital tuning value OTW1 is obtained, the DCO gain estimation unit 20 sets a frequency control digital value FCW2, which is different from the frequency control digital value FCW1, in the accumulator 12 (S12). The DCO gain estimation unit 20 obtains the second digital tuning value OTW2 when the convergence condition of the small mode SM is determined to be satisfied by the mode switch unit 21 (time t3 of FIG. 4) (S13). At this occasion, a temporary DCO gain $K_{DCOS}$ of the small mode SM is also set in the DCO gain normalization unit 19.

When the second digital tuning value OTW2 is obtained, the DCO gain estimation unit 20 estimates the DCO gain $K_{DCOS}$ of the small mode SM using the reference frequency signal Fref, the frequency control digital value FCW1, the frequency control digital value FCW2, the second digital tuning value OTW1, and the second digital tuning value OTW2 (S14).

The frequency fv of the output signal Fout of the digitally controlled oscillator 10 is represented as a product of the reference frequency signal Fref and the frequency control digital value FCW. Therefore, the change Δfv of the frequency fv of the output signal Fout is represented as a product of the reference frequency signal Fref and the change ΔFCW of the frequency control digital value FCW. Therefore, the DCO gain $K_{DCO}$ to be estimated is calculated by Expression 1 below.

$$K_{DCO} = \Delta fv / \Delta OTW = (FCW2 - FCW1) \cdot Fref/(OTW2 - OTW1)$$ (Expression 1)

When the DCO gain $K_{DCOS}$ of the small mode SM is calculated, the DCO gain estimation unit 20 sets the calculated DCO gain $K_{DCOS}$ in the DCO gain normalization unit 19. Thereafter, when the convergence condition of the small mode SM is determined to be satisfied by the mode switch unit 21 (time t4 of FIG. 4), the entire tuning process is completed. FIG. 4 is drawn such that estimation processing of the DCO gain $K_{DCOL}$ of the large mode LM and the DCO gain $K_{DCOM}$ of the middle mode MM is omitted.

Subsequently, the specific configuration of the digitally controlled oscillator 10 will be described. In the present embodiment, an example will be described in which the digitally controlled oscillator 10 includes an LC oscillator.

Figure 6:
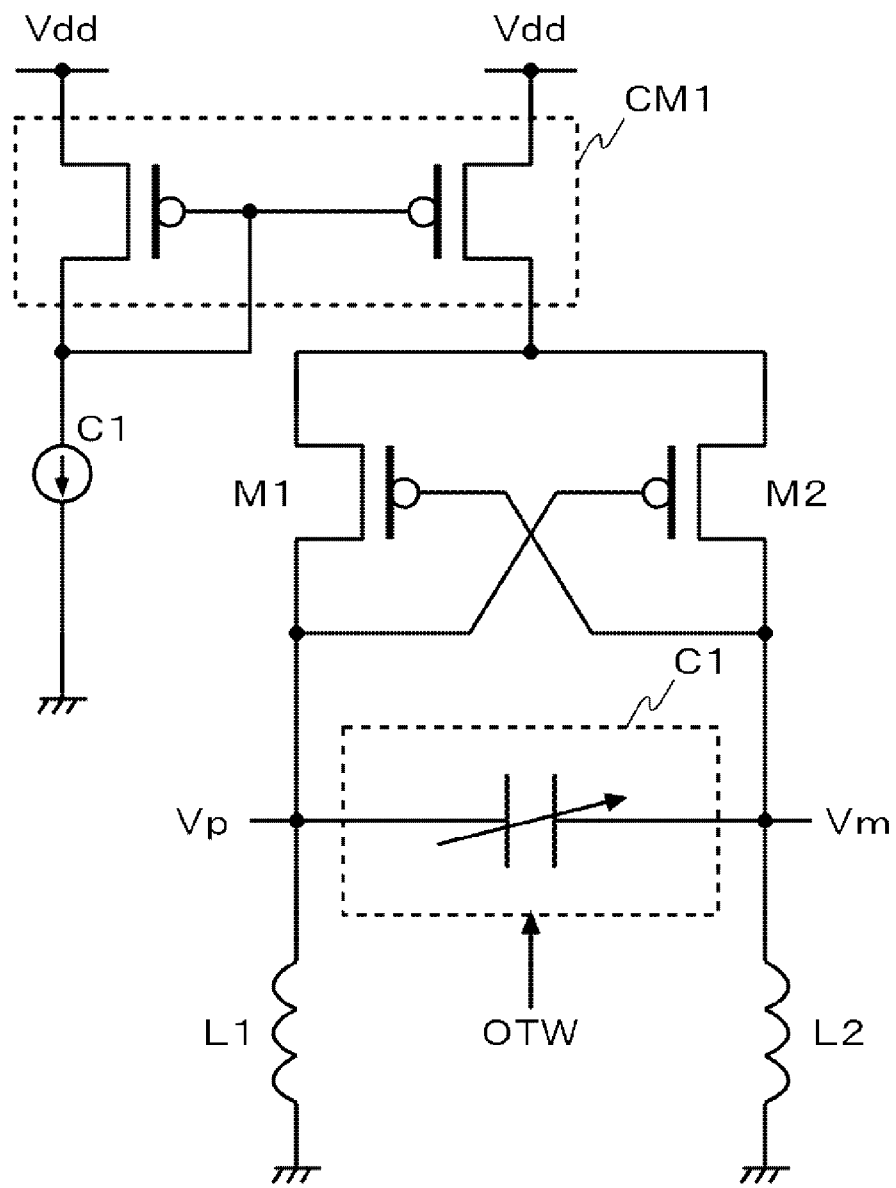
FIG. 6 is a figure illustrating an example of configuration of an LC oscillator according to an embodiment.

FIG. 6 is a figure illustrating an example of configuration of an LC oscillator according to the embodiment. A current flowing in a constant-current source C1 is copied to a common source terminal of a pair of a first P-channel transistor M1 and a second P-channel transistor through a current mirror circuit CM1. The gate terminal of the first P-channel transistor M1 is connected to the drain terminal of the second P-channel transistor M2. The gate terminal of the second P-channel transistor M2 is connected to the drain terminal of the first P-channel transistor M1.

The drain terminal of the first P-channel transistor M1 is connected to the gate terminal of the second P-channel transistor M2, one end of the first inductor L1, and the positive terminal of the tank capacitor C1. The drain terminal of the second P-channel transistor M2 is connected to the gate terminal of the first P-channel transistor M1, one end of the second inductor L2, and the negative terminal of a tank capacitor C1. The other end of the first inductor L1 and the other end of the second inductor L2 are grounded. The second digital tuning value OTW is input to the tank capacitor C1, and the capacitance of the tank capacitor C1 is variable.

The frequency of the output signal of the LC oscillator depends on a product of the inductance L of the first inductor L1 and the second inductor L2 and the capacitance C of the tank capacitor C1. In this case, the inductance L is fixed, and therefore, the frequency can be changed by changing the capacitance C.

Figure 7:
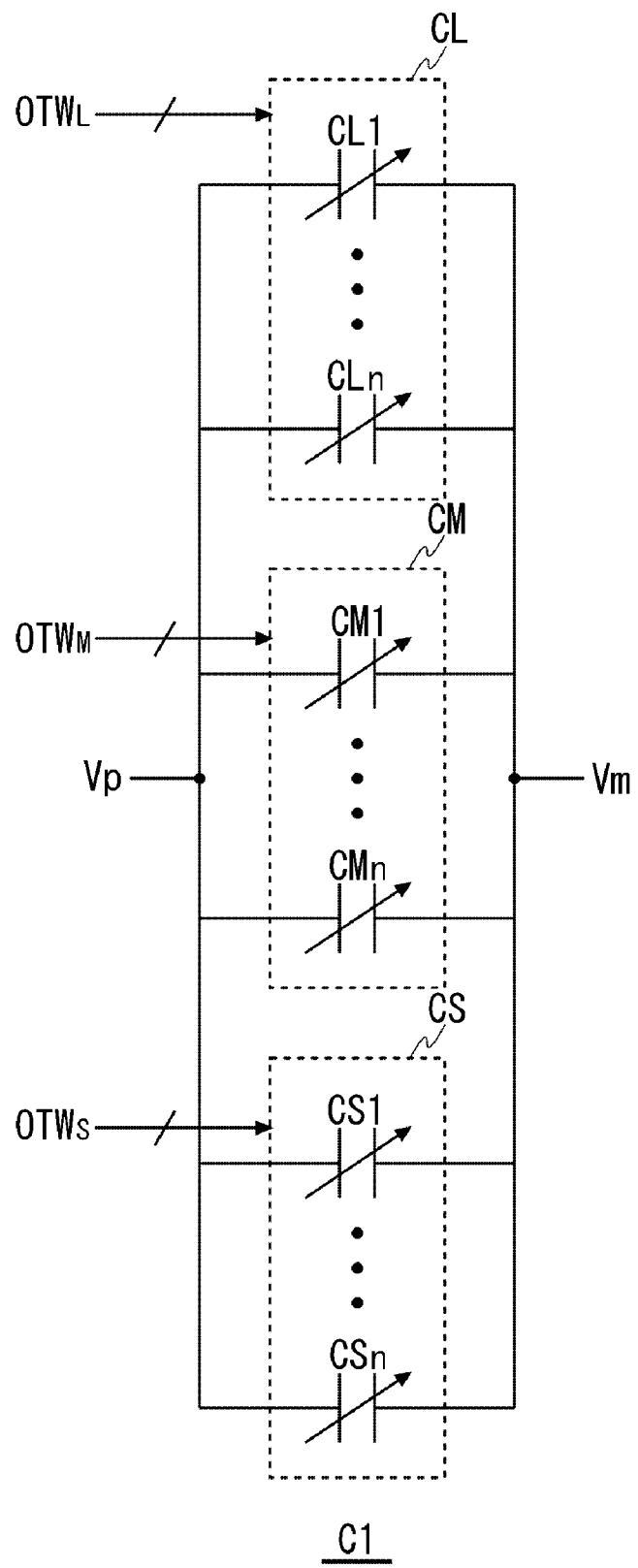
FIG. 7 is a figure illustrating an example of configuration of a tank capacitor.

FIG. 7 is a figure illustrating an example of configuration of the tank capacitor C1. The tank capacitor C1 includes a plurality of capacitor arrays corresponding to the number of modes. In this case, the tank capacitor C1 includes three capacitor arrays, i.e., a capacitor array CL for the large mode, a capacitor array CM for the middle mode, and a capacitor array CS for the small mode. The capacitor array CL for the large mode, the capacitor array CM for the middle mode, and the capacitor array CS for the small mode are connected in parallel. Each of the capacitor array CL for the large mode, the capacitor array CM for the middle mode, and the capacitor array CS for the small mode includes a plurality of varactors.

The capacitor array CL for the large mode includes a plurality of varactors CL1 to CLn. The plurality of varactors CL1 to CLn is connected in parallel. The combined capacitance of the plurality of varactors CL1 to CLn is set by the second digital tuning value $OTW_L$ which is input in the large mode LM.

The number of plurality of varactors CL1 to CLn is determined by the number of tuning points of the output signal Fout available for transition in the large mode LM and whether the second digital tuning value $OTW_L$ is defined by a binary code or a thermometer code.

For example, when 128 operation points are set, and the second digital tuning value $OTW_L$ is defined by a binary code, seven varactors CL1 to CL7 are required. When the second digital tuning value $OTW_L$ is defined by a thermometer code, 127 varactors CL1 to CL127 are required. In the former case, it is necessary to weight each capacitance of the varactors CL1 to CL7. The capacitances of the varactors of the least significant bit to the most significant bit are required to be set as 1, 2, 4, . . . , 64 times larger, respectively. In the latter case, all the capacitances of the varactors CL1 to CL127 can be set at the same value.

The capacitance of each of the plurality of varactors CL1 to CLn is determined by the step width of the tuning point in the large mode LM and whether the second digital tuning value $OTW_L$ is defined by a binary code or a thermometer code.

When the second digital tuning value $OTW_L$ is defined by a binary code, the capacitance thereof is determined such that the capacitance of the varactor of the least significant bit is converted into the frequency of the step width. When the second digital tuning value $OTW_L$ is defined by a thermometer code, all the capacitances of the plurality of varactors CL1 to CLn are determined such that the capacitances are converted into the frequency of the step width.

An ON/OFF state of each of the plurality of varactors CL1 to CLn is set by the second digital tuning value $OTW_L$, so that the combined capacitance of the capacitor array CL for the large mode is determined.

The capacitor array CM for the middle mode also includes a plurality of varactors CM1 to CMn. The plurality of varactors CM1 to CMn is connected in parallel. The combined capacitance of the plurality of varactors CM1 to CMn is set by the second digital tuning value $OTW_M$ which is input in the middle mode MM. The consideration described with regard to the capacitor array CL for the large mode is applicable to the number of plurality of varactors CM1 to CMn and the condition about the capacitances.

The capacitor array SM for the small mode also includes a plurality of varactors CS1 to CSn. The plurality of varactors CS1 to CSn is connected in parallel. The combined capacitance of the plurality of varactors CS1 to CSn is set by the second digital tuning value $OTW_S$ which is input in the small mode SM. The consideration described with regard to the capacitor array CL for the large mode is applicable to the number of plurality of varactors CS1 to CSn and the condition about the capacitances.

Ultimately, the target frequency is set by the total combined capacitance of the combined capacitance of the capacitor array CL for the large mode, the combined capacitance of the capacitor array CM for the middle mode, and the combined capacitance of the capacitor array CS for the small mode.

Subsequently, a method capable of estimating the DCO gain $K_{DCO}$ in a shorter time than the estimation processing of the DCO gain $K_{DCO}$ as shown in FIGS. 4 and 5 will be described. On the basis of the DCO gain $K_{DCO}$ estimated in a certain mode and a device parameter of the digitally controlled oscillator 10, the DCO gain estimation unit 20 estimates the DCO gain $K_{DCO}$ in another mode. For example, the DCO gain estimation unit 20 estimates the DCO gain $K_{DCOS}$ of the small mode SM on the basis of the DCO gain $K_{DCOM}$ of the middle mode MM estimated in the middle mode MM and a device parameter of the digitally controlled oscillator 10.

The combined capacitance of the plurality of capacitor arrays included in the LC oscillator can be used as the device parameter. On the basis of the DCO gain $K_{DCO}$ estimated in a certain mode and a ratio between the unit step width of the combined capacitance of the capacitor array for the mode in question and the unit step width of the combined capacitance of the capacitor array for another mode, the DCO gain estimation unit 20 estimates the DCO gain $K_{DCO}$ in the another mode.

For example, the DCO gain estimation unit 20 estimates the DCO gain $K_{DCOS}$ of the small mode SM on the basis of the DCO gain $K_{DCOM}$ of the middle mode MM estimated in the middle mode MM and a ratio between unit step width $\Delta Cm$ of the combined capacitance of the capacitor array CM for the middle mode and the unit step width $\Delta Cs$ of the combined capacitance of the capacitor array CS for the small mode. More specifically, the DCO gain $K_{DCOS}$ of the small mode SM is estimated by multiplying the DCO gain $K_{DCOM}$ of the middle mode MM by a ratio between the unit step width $\Delta Cm$ of the combined capacitance of the capacitor array CM for the middle mode and the unit step width $\Delta Cs$ of the combined capacitance of the capacitor array CS for the small mode ($\Delta Cs/\Delta Cm$).

Figure 8:
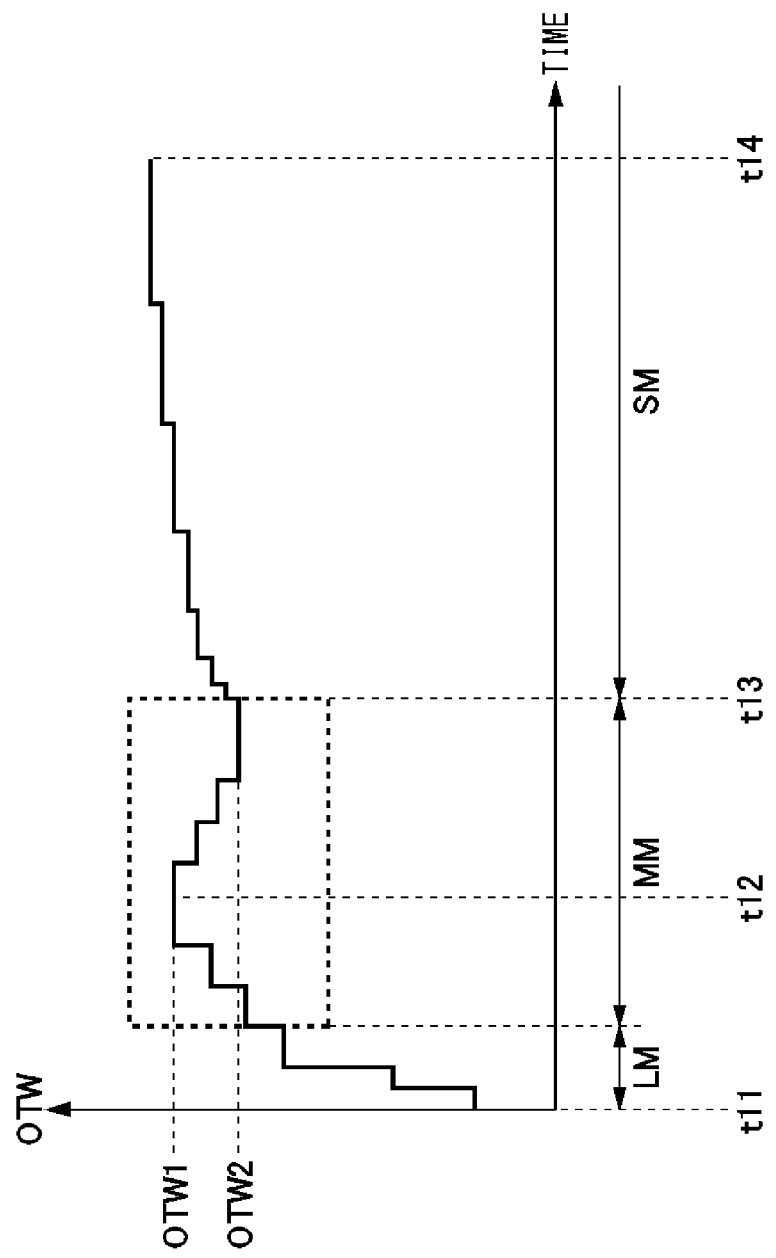
FIG. 8 is a figure illustrating an example of transition of the second digital tuning value when the DCO gain in the small mode is estimated from the DCO gain in the middle mode.

FIG. 8 is a figure illustrating an example of transition of the second digital tuning value OTW when the DCO gain $K_{DCOS}$ of the small mode SM is estimated from the DCO gain $K_{DCOM}$ of the middle mode MM.

At time t11, the frequency control digital value FCW1 is set in the accumulator 12 by an external unit. The mode switch unit 21 switches the mode to the large mode LM and the middle mode MM in order. In the middle mode MM, the DCO gain estimation unit 20 obtains the second digital tuning value OTW1 when the convergence condition of the middle mode MM is determined to be satisfied by the mode switch unit 21 (time t12 of FIG. 8).

When the second digital tuning value OTW1 is obtained, the DCO gain estimation unit 20 sets the frequency control digital value FCW2, which is different from the frequency control digital value FCW1, in the accumulator 12. The DCO gain estimation unit 20 obtains the second digital tuning value OTW2 when the convergence condition of the middle mode MM is determined to be satisfied by the mode switch unit 21 (time t13 of FIG. 8). The mode switch unit 21 switches the mode from the middle mode MM to the small mode SM.

When the second digital tuning value OTW2 is obtained, the DCO gain estimation unit 20 estimates the DCO gain $K_{DCOM}$ of the middle mode MM using the reference frequency signal Fref, the frequency control digital value FCW1, the frequency control digital value FCW2, the second digital tuning value OTW1, and the second digital tuning value OTW2. As described above, the DCO gain estimation unit 20 estimates the DCO gain $K_{DCOM}$ of the middle mode MM using the method as shown in FIG. 5.

When the DCO gain $K_{DCOM}$ of the middle mode MM is estimated, the DCO gain estimation unit 20 estimates the DCO gain $K_{DCOS}$ of the small mode SM by multiplying the DCO gain $K_{DCOM}$ by a ratio between the unit step width $\Delta Cm$ of the combined capacitance of the capacitor array CM for the middle mode and the unit step width $\Delta Cs$ of the combined capacitance of the capacitor array CS for the small mode ($\Delta Cs/\Delta Cm$). When the DCO gain $K_{DCOS}$ of the small mode SM is estimated, the DCO gain estimation unit 20 sets the DCO gain $K_{DCOS}$ in the DCO gain normalization unit 19. Thereafter, when the convergence condition of the small mode SM is determined to be satisfied by the mode switch unit 21 (time t14 of FIG. 8), the entire tuning process is completed.

As compared with the method described in FIGS. 4 and 5, this method allows estimating the DCO gain $K_{DCOS}$ of the small mode SM in a shorter time because it is not necessary to set the frequency control digital value FCW2 for estimation and obtain the second digital tuning value OTW2 for estimation in the DCO gain $K_{DCOS}$ of the small mode SM estimation processing. Therefore, the entire tuning time can be greatly reduced.

In the above explanation, for example, the DCO gain $K_{DCOM}$ of the middle mode MM and the ratio between the unit step width $\Delta Cm$ of the combined capacitance of the capacitor array CM for the middle mode and the unit step width $\Delta Cs$ of the combined capacitance of the capacitor array CS for the small mode are used to estimate the DCO gain $K_{DCOS}$ of the small mode. Alternatively, the DCO gain $K_{DCOL}$ of the large mode LM and a ratio between a unit step width $\Delta Cl$ of the combined capacitance of the capacitor array CL for the large mode and a unit step width $\Delta Cs$ of the combined capacitance of the capacitor array CS for the small mode may be used to estimate the DCO gain $K_{DCOS}$ for the small mode SM.

In the above explanation, for example, the three modes, i.e., the large mode LM, the middle mode MM, and the small mode SM, are set. Alternatively, two modes may be set, or four modes or more may be set. Hereinafter, among these modes, a mode for relatively roughly changing the frequency fv of the output signal Fout of the digitally controlled oscillator 10 is called a rough adjustment mode, and a mode for relatively finely changing the frequency fv of the output signal Fout thereof is called a fine adjustment mode.

The DCO gain estimation unit 20 estimates the DCO gain of the fine adjustment mode on the basis of a DCO gain estimated in the rough adjustment mode and a ratio between a unit step width of a combined capacitance of a capacitor array for the rough adjustment mode and a unit step width of a combined capacitance of a capacitor array for the fine adjustment mode.

As described above, according to the present embodiment, when a DCO gain is estimated in a certain mode, the DCO gain is not estimated on the basis of data actually observed in the mode. Instead, the DCO gain is estimated on the basis of a DCO gain in another mode, so that the estimation processing of the DCO gain can be performed in a shorter time.

Figure 9:
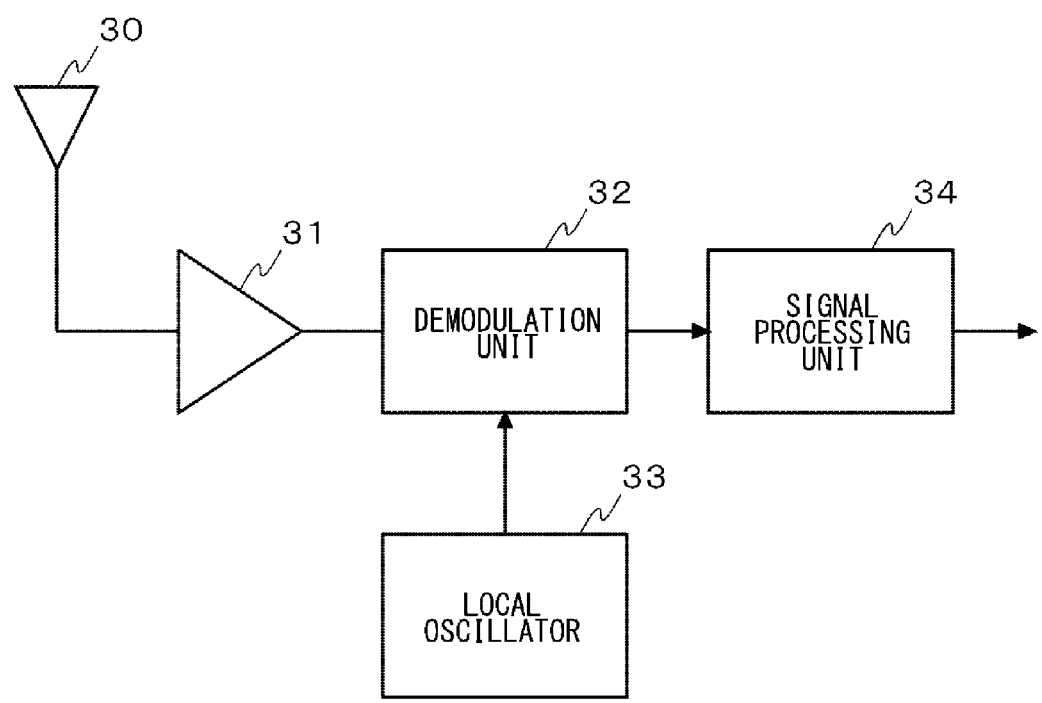
FIG. 9 is a figure illustrating a configuration of a radio communication apparatus having an ADPLL circuit according to the embodiment as a local oscillator.

FIG. 9 is a figure illustrating a configuration of a radio communication apparatus 200 having an ADPLL circuit 100 according to the embodiment as a local oscillator. The radio communication apparatus 200 includes an antenna 30, a low noise amplifier 31, a demodulation unit 32, a local oscillator 33, and a signal processing unit 34. The local oscillator 33 employs the ADPLL circuit 100 according to the embodiment.

The antenna 30 receives a radio signal. The low noise amplifier 31 amplifies the received radio signal. The demodulation unit 32 demodulates the radio signal into a baseband signal on the basis of the signal provided by the local oscillator 33. The signal processing unit 34 processes the baseband signal.

When the ADPLL circuit 100 according to the embodiment is used for the radio communication apparatus 200, the large mode LM, the middle mode MM, and the small mode SM are assumed to be a calibration mode, a channel selection mode, and a tracking mode, respectively.

The calibration mode is a mode for calibrating the process, the power supply voltage, and the temperature. In the calibration mode, the tuning point changes with a rough step width in a wide frequency range. The channel selection mode is a mode for selecting a channel after the calibration. In the channel selection mode, the tuning point changes with a finer step width than that of the calibration mode, in a frequency range limited as compared with the calibration mode. The tracking mode is a mode kept during actual receiving operation after the channel is selected. In the tracking mode, the tuning point changes with the finest step width in a frequency range limited as compared with the channel selection mode.

When the ADPLL circuit 100 according to the present embodiment is applied to the radio communication apparatus 200 as described above, analog components such as a charge pump can be reduced, and the size of the circuit can be reduced. In addition, the low noise amplifier 31, the demodulation unit 32, the local oscillator 33, and the signal processing unit 34 can be easily made into a single chip, which used to be difficult in the past. In FIG. 9, an example of receiver apparatus has been described. Alternatively, this may also be applied to a transmitter apparatus.

The present invention has been hereinabove described using several embodiments. These embodiments are merely examples, and a person skilled in the art would understand that various modifications can be made in combinations of constituent elements and processes thereof, and such modifications are also within the scope of the present invention.

In the above embodiments, the unit step width of the capacitor array when the digitally controlled oscillator 10 includes the LC oscillator is used as the device parameter of the digitally controlled oscillator 10. With regard to this point, the device parameter may be a unit step width of the inductor array when the inductor is configured to be variable instead of the capacitor. When the digitally controlled oscillator 10 includes a ring oscillator, and a plurality of inverters is configured as a Digital to Analog Converter (DAC), the device parameter may be a unit step width of the inverter array including the plurality of inverters.

In the above explanation about the embodiment, a method for causing the DCO gain estimation unit 20 to estimate the DCO gain $K_{DCO}$ according to the foreground self-calibration method has been described. In other words, the DCO gain estimation unit 20 estimates the DCO gain $K_{DCO}$ from the ratio between a change $\Delta fv$ of the frequency fv of the output signal Fout of the digitally controlled oscillator 10 and a change $\Delta OTW$ of the second digital tuning value OTW obtained by changing the frequency control digital value FCW. With regard to this point, a modification will be described in which the DCO gain estimation unit 20 estimates the DCO gain $K_{DCO}$ according to the background self-calibration method.

Figure 10:
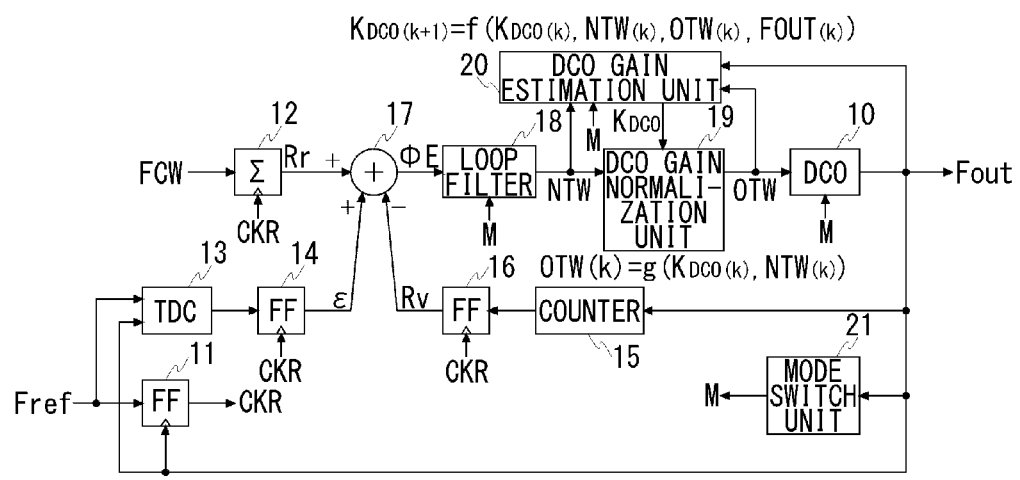
FIG. 10 is a figure illustrating a configuration of an ADPLL circuit according to a modification.

FIG. 10 is a figure illustrating a configuration of an ADPLL circuit 100 according to a modification. As compared with the ADPLL circuit 100 as shown in FIG. 1, the processing performed by the DCO gain estimation unit 20 is different. In the modification, the DCO gain estimation unit 20 estimates the DCO gain $K_{DCO}$ using adaptation algorithm and the like while obtaining time-change data (i.e., values in a transition state) of each of the first digital tuning value NTW, the second digital tuning value OTW, and the frequency fv of the output signal Fout. For example, the DCO gain $K_{DCO}$ is calculated in a form of a recurrence formula between two adjacent terms from time-change data of each of the first digital tuning value NTW, the second digital tuning value OTW, and the frequency fv of the output signal Fout. The DCO gain estimation unit 20 sets the estimated DCO gain $K_{DCO}$ in the DCO gain normalization unit 19.

The DCO gain normalization unit 19 obtains the second digital tuning value OTW using a function of the DCO gain $K_{DCO}$ set with the DCO gain estimation unit 20 and the first digital tuning value NTW input from the loop filter 18, and outputs the second digital tuning value OTW to the digitally controlled oscillator 10 and the DCO gain estimation unit 20. For example, the function may be a function for multiplying the first digital tuning value NTW by the value obtained by dividing the reference frequency signal Fref by the DCO gain $K_{DCO}$ ($Fref/K_{DCO}$) as described above.

As described above, with the background self-calibration method according to the modification, the DCO gain $K_{DCO}$ can be estimated without stopping normal operation of the ADPLL circuit 100, in contrast to the foreground self-calibration method requiring a special time for estimating the DCO gain $K_{DCO}$. Therefore, the ADPLL circuit 100 can be applied to a wide range of applications.

DESCRIPTION OF REFERENCE NUMERALS

C1 tank capacitor, M1 first P-channel transistor, C1 constant-current source, CM1 current mirror, L1 first inductor, M2 second P-channel transistor, L2 second inductor, CL capacitor array for large mode, CM capacitor array for middle mode, CS capacitor array for small mode, 10 digitally controlled oscillator, 11 retiming clock generation unit, 12 accumulator, 13 time/digital converter, 14 first flip-flop circuit, 15 counter, 16 second flip-flop circuit, 17 phase detector, 18 loop filter, 19 DCO gain normalization unit, 20 DCO gain estimation unit, 21 mode switch unit, 30 antenna, 31 low noise amplifier, 32 demodulation unit, 33 local oscillator, 34 signal processing unit, 100 ADPLL circuit, 200 radio communication apparatus

INDUSTRIAL APPLICABILITY

The present invention can be applied to fields such as a radio communication apparatus.

What is claimed is:

1. A PLL circuit comprising:
a digitally controlled oscillator for oscillating at a frequency according to a set digital value;
a phase detector for generating a phase error value by detecting an error between an output phase of the digitally controlled oscillator and a reference phase based on a set frequency control digital value;
a loop filter for generating a first digital tuning value by multiplying a phase error value output from the phase detector by a predetermined loop gain;
an oscillator gain normalization unit which generates a second digital tuning value set in the digitally controlled oscillator, by multiplying the first digital tuning value output from the loop filter by a predetermined reference frequency and dividing the value by a set gain of the digitally controlled oscillator;
an oscillator gain estimation unit which estimates the gain of the digitally controlled oscillator, on the basis of the second digital tuning value output from the oscillator gain normalization unit; and
a mode switch unit which switches the value of the loop gain set in the loop filter in a stepwise manner during tuning, wherein
in a certain mode, the oscillator gain estimation unit estimates the gain of the digitally controlled oscillator from a ratio between a change of a frequency of the output signal of the digitally controlled oscillator and a change of the second digital tuning value obtained by changing the frequency control digital value, and the oscillator gain estimation unit estimates a gain of the digitally controlled oscillator in another mode, on the basis of a device parameter of the digitally controlled oscillator and the gain of the digitally controlled oscillator estimated in the certain mode.

2. The PLL circuit according to claim 1, wherein the digitally controlled oscillator includes an LC oscillator, the LC oscillator includes a plurality of capacitor arrays corresponding to the number of modes, each capacitor array includes a plurality of varactors, a combined capacitance of the plurality of varactors is set by the second digital tuning value, and the oscillator gain estimation unit estimates the gain of the digitally controlled oscillator in another mode on the basis of the gain of the digitally controlled oscillator estimated in the certain mode and a ratio between a unit step width of a combined capacitance of the capacitor array for the certain mode and a unit step width of the combined capacitance of the capacitor array for the another mode.

3. The PLL circuit according to claim 2, wherein during tuning, the mode switch unit switches a mode from a rough adjustment mode in which the frequency of the output signal of the digitally controlled oscillator is roughly changed to a fine adjustment mode in which the frequency is changed finely as compared with the rough adjustment mode, and the oscillator gain estimation unit estimates a gain of the digitally controlled oscillator in the fine adjustment mode on the basis of the gain of the digitally controlled oscillator estimated in the rough adjustment mode and a ratio between a unit step width of a combined capacitance of the capacitor array for the rough adjustment mode and a unit step width of a combined capacitance of the capacitor array for the fine adjustment mode.

4. The PLL circuit according to claim 2, wherein during tuning, the mode switch unit switches, in order, to a large mode in which the frequency of the output signal of the digitally controlled oscillator is changed most greatly, to a middle mode in which the frequency is changed less greatly than the large mode, and to a small mode in which the frequency is changed less greatly than the middle mode, and the oscillator gain estimation unit estimates a gain of the digitally controlled oscillator in the small mode on the basis of the gain of the digitally controlled oscillator estimated in the middle mode and a ratio between a unit step width of a combined capacitance of the capacitor array for the middle mode and a unit step width of a combined capacitance of the capacitor array for the small mode.

5. A PLL circuit comprising:

a digitally controlled oscillator for oscillating at a frequency according to a set digital value;

a phase detector for generating a phase error value by detecting an error between an output phase of the digitally controlled oscillator and a reference phase based on a set frequency control digital value;

a loop filter for generating a first digital tuning value by multiplying a phase error value output from the phase detector by a predetermined loop gain;

an oscillator gain normalization unit which generates a second digital tuning value set in the digitally controlled oscillator, by multiplying the first digital tuning value output from the loop filter by a predetermined reference frequency and dividing the value by a set gain of the digitally controlled oscillator;

an oscillator gain estimation unit which estimates the gain of the digitally controlled oscillator, on the basis of the second digital tuning value output from the oscillator gain normalization unit; and a mode switch unit which switches the value of the loop gain set in the loop filter in a stepwise manner during tuning, wherein the oscillator gain estimation unit estimates the gain of the digitally controlled oscillator from time-change data of each of the first digital tuning value, the second digital tuning value, and the frequency of the output signal of the PLL circuit, and the oscillator gain estimation unit estimates a gain of the digitally controlled oscillator in another mode, on the basis of a device parameter of the digitally controlled oscillator and the gain of the digitally controlled oscillator estimated in the certain mode.

6. A radio communication apparatus comprising:

an antenna for receiving a radio signal;

a local oscillator using the PLL circuit according to claim 1; and a demodulation unit which demodulates a radio signal received with the antenna on the basis of a signal provided from the local oscillator.

* * * * *

UNITED STATES PATENT AND TRADEMARK OFFICE
CERTIFICATE OF CORRECTION

| | | |
|---|---|---|
| PATENT NO. | : 8,515,374 B2 | |
| APPLICATION NO. | : 13/381608 | |
| DATED | : August 20, 2013 | |
| INVENTOR(S) | : Toru Dan et al. | |

It is certified that error appears in the above-identified patent and that said Letters Patent is hereby corrected as shown below:

On the Title Page, Item [73]
         Add the second assignees name "NATIONAL UNIVERSITY CORPORATION GUNMA UNIVERSITY**"
         Add the second assignees Residence "JAPAN**"

Signed and Sealed this
Fourteenth Day of October, 2014

Michelle K. Lee
*Deputy Director of the United States Patent and Trademark Office*